(12) United States Patent
Uchikoba et al.

(10) Patent No.: US 7,038,967 B2
(45) Date of Patent: May 2, 2006

(54) SEMICONDUCTOR APPARATUS CAPABLE OF PERFORMING REFRESH CONTROL

(75) Inventors: Toshitaka Uchikoba, Hyogo (JP); Tomonori Fujimoto, Osaka (JP); Kiyoto Ohta, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/864,814

(22) Filed: Jun. 10, 2004

(65) Prior Publication Data

US 2005/0052923 A1    Mar. 10, 2005

(30) Foreign Application Priority Data

Jun. 13, 2003    (JP) .......................... P2003-169826

(51) Int. Cl.
*G11C 7/00*    (2006.01)
*G11C 7/04*    (2006.01)

(52) U.S. Cl. ...................... 365/222; 365/212

(58) Field of Classification Search ................ 365/222, 365/211, 212; 331/57, 66, 176
See application file for complete search history.

(56) References Cited

U.S. PATENT DOCUMENTS 5,180,995 A  *  1/1993  Hayashi et al. ............... 331/57
5,499,214 A  *  3/1996  Mori et al. ................... 365/222
5,774,404 A  *  6/1998  Eto ............................. 365/222
5,898,343 A  *  4/1999  Morgan ........................ 331/57
6,304,148 B1    10/2001  Nomura et al.
6,628,558 B1 *  9/2003  Fiscus ......................... 365/222
6,667,925 B1 * 12/2003  Kobayashi et al. ......... 365/211
6,731,558 B1 *  5/2004  Yamauchi et al. .......... 365/222
6,856,566 B1 *  2/2005  Takahashi et al. .......... 365/222

FOREIGN PATENT DOCUMENTS

JP    P2002-117671 A    4/2002

* cited by examiner

*Primary Examiner*—Son L. Mai
(74) *Attorney, Agent, or Firm*—McDermott Will & Emery LLP

(57) ABSTRACT

A semiconductor apparatus according to the present invention comprises a current source increasing a current volume in compliance with a rise of a temperature and an oscillation circuit driven by the current of the current source and outputting a clock for refresh control. The semiconductor apparatus, preferably, further comprises a memory device performing the refresh in synchronization with the output clock of the oscillation circuit or the divided clock thereof. The semiconductor apparatus, preferably, further comprises a constant voltage source generating a constant voltage using the current source, an oscillation circuit using the current of the current source, and a memory using the constant voltage generated by the constant voltage source as a reference voltage for a power supply circuit and performing the refresh in synchronization with the output clock of the oscillation circuit or the divided clock thereof.

21 Claims, 10 Drawing Sheets

F I G. 7
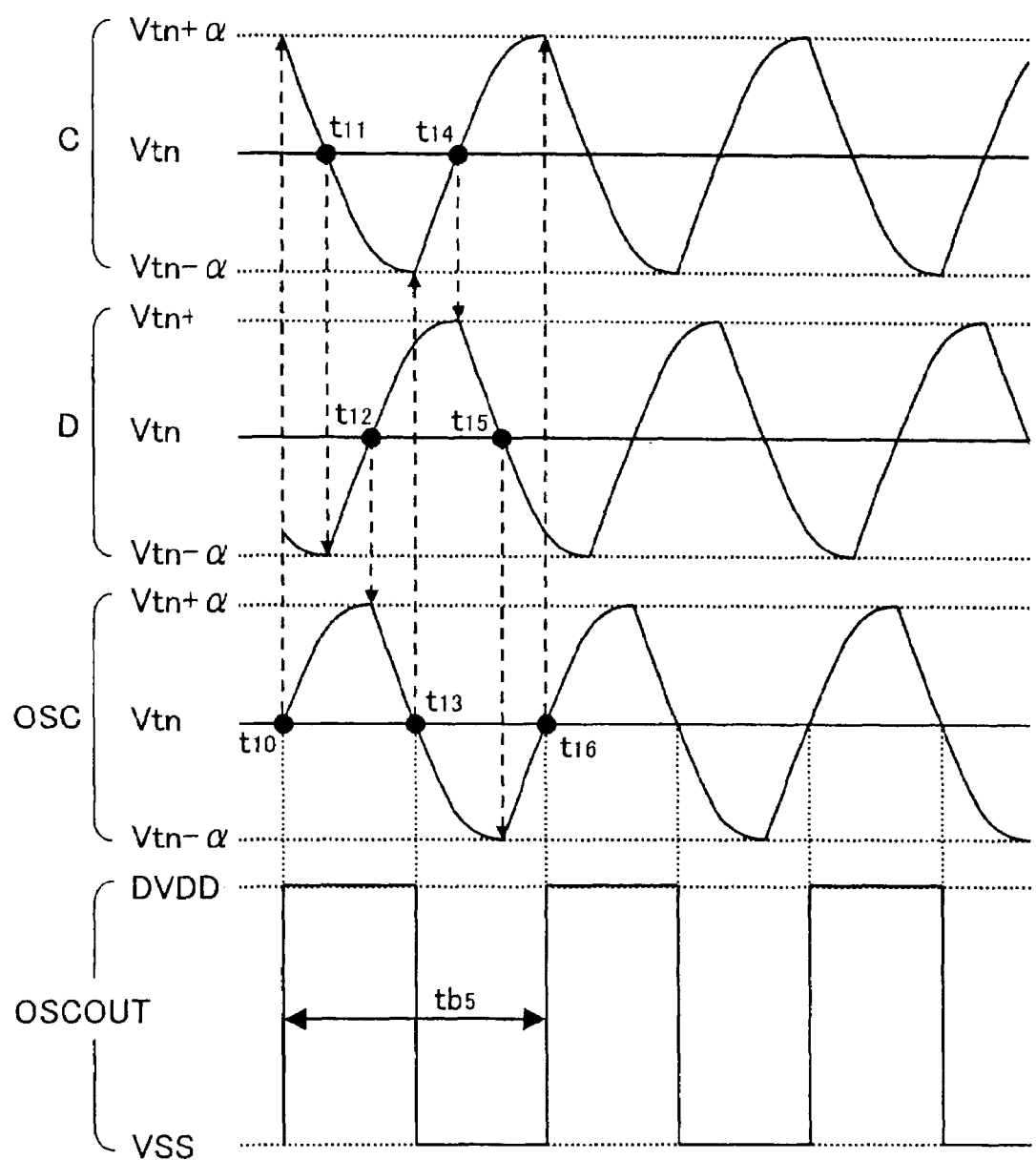

SEMICONDUCTOR APPARATUS CAPABLE OF PERFORMING REFRESH CONTROL

BACKGROUND OF THE INVENTION

The present invention relates to a semiconductor apparatus having a refresh control circuit installed therein.

FIELD OF THE INVENTION

A dynamic random access memory (hereinafter, referred to as DRAM), which is an example of a semiconductor apparatus, comprises a memory cell formed from an access transistor and a capacitor. In the DRAM, electric charge is stored in the capacitor, and the stored electric charge is retained in the form of data of logic "1" or data of logic "0". However, because the electric charge leaks over time to thereby decrease, the data is lost if left unattended. The DRAM, therefore, performs an operation called refresh, in which the electric charge is periodically rewritten before the data is lost.

A conventional semiconductor apparatus is described below.

FIG. 9 is a block diagram illustrating a circuit configuration of a conventional semiconductor apparatus. The semiconductor apparatus is comprised of a timer circuit 1 and self-refresh control circuit 3. The timer circuit 1 comprises a ring oscillator 2 formed from an odd number of CMOS inverters IV1–IV3 and a buffer BF1 for buffering an oscillation pulse signal therefrom. The self-refresh control circuit 3 inputs an output clock signal OSCOUT and a self-refresh control signal SELFEN from the timer circuit 1 therein, and outputs an internal RAS signal SIRAS used for refreshing (RAS: row address strobe).

The operation of the semiconductor apparatus configured as described is described as follows.

As shown in FIGS. 9 and 10, the self-refresh control circuit 3, in receipt of the output clock signal OSCOUT (cycle tb) of the timer circuit 1, generates the internal RAS signal SIRAS (cycle ta) obtained by dividing a frequency of the output clock signal OSCOUT during the time when the self-refresh control signal SELFEN is in an active high state, and performs the self-refresh operation by means of the internal RAS signal SIRAS.

For example, in the case of a DRAM having 2 MB, when the internal RAS signal SIRAS is generated 256 times, an entire memory cell thereof can be refreshed, meaning that a length of time from the time when a memory cell is refreshed once until the memory cell is refreshed again, which is a refresh interval $T_{RF}$, is ta*256. Therefore, the time ta*256 should be equal to or below the time span when the data of the memory cell is lost. Further, a data retaining time $T_{DH}$ of the memory cell usually decreases as a temperature rises, as shown in FIG. 11. From the aspect, the refresh interval $T_{RF}$ is set to a time $T_1$, during which the refresh can be performed without fail at a maximum guaranteed temperature Tmax.

However, the cycle tb of the pulse signal generated in the ring oscillator comprised of the conventional CMOS inverters is generally lengthened as the temperature rises, therefore the cycle of the internal RAS signal SIRAS synchronizing with the pulse signal is accordingly lengthened. Because of that, the refresh interval $T_{RF}$ is also extended as the temperature rises, as shown in FIG. 11. The refresh interval $T_{RF}$, which is set to the time $T_1$ enabling the refresh to be performed without fail at the maximum guaranteed temperature Tmax as described earlier, is allowed to be a time $T_2$ on a lower-temperature side (minimum guaranteed temperature Tmin) because of its data retaining characteristic improving as the temperature falls. In fact, the refresh interval $T_{RF}$ is reduced as the temperature falls, resulting in $T_3$. For that reason, the conventional technology includes a disadvantage that the refresh is performed at a frequency higher than necessary on the lower-temperature side, thereby ineffectively consuming electricity. Further, the fluctuation of a power supply voltage causes an oscillation pulse cycle of the ring oscillator to fluctuate, creating a deviation from a desired cycle.

SUMMARY OF THE INVENTION

A semiconductor apparatus according to the present invention comprises a current source increasing a current volume as a temperature rises and an oscillation circuit driven by electric current from the current source and outputting a clock for refresh control.

According to the foregoing configuration, the current source increasing the current volume in compliance with the temperature rise is comprised as the current source for the oscillation circuit, and the oscillation circuit is driven using the current having a positive temperature characteristic from the current source, wherein a cycle of the output clock of the oscillation circuit is shortened as the temperature rises, while being lengthened as the temperature falls.

A semiconductor apparatus according to the present invention, preferably, further comprises a memory performing the refresh in synchronization with the output clock of the oscillation circuit or the divided clock thereof.

According to the foregoing configuration, the current source increasing the current volume in compliance with the temperature rise is comprised as the current source for the oscillation circuit, and the oscillation circuit is driven using the current having the positive temperature characteristic from the current source, wherein the output clock of the oscillation circuit is shortened as the temperature rises, while being lengthened as the temperature falls. Therefore, a frequency of refreshing is reduced at a low temperature, which is reasonable in terms of the premise that the refreshing frequency should be reduced when the temperature is low because data can be retained for a longer time. The reduction of the refreshing frequency at a low temperature can achieve an effective consumption of the electricity.

The semiconductor apparatus according to the present invention, preferably, further comprises a constant voltage source generating a constant voltage using the current source and a memory using the constant voltage generated by the constant voltage source as a reference voltage for a power supply circuit and performing the refresh in synchronization with the output clock of the oscillation circuit and the divided clock thereof.

According to the present invention, a power supply having an outstanding characteristic including no temperature characteristic can be provided by using the constant voltage of the constant voltage source as the reference potential for the power supply circuit in the memory.

BRIEF DESCRIPTION OF THE DRAWINGS

FIG. 7 is a view representing an internal waveform and an output waveform of the timer circuit of the semiconductor apparatus according to the embodiment 2.

DESCRIPTION OF THE PREFERRED EMBODIMENTS

Figure 1:
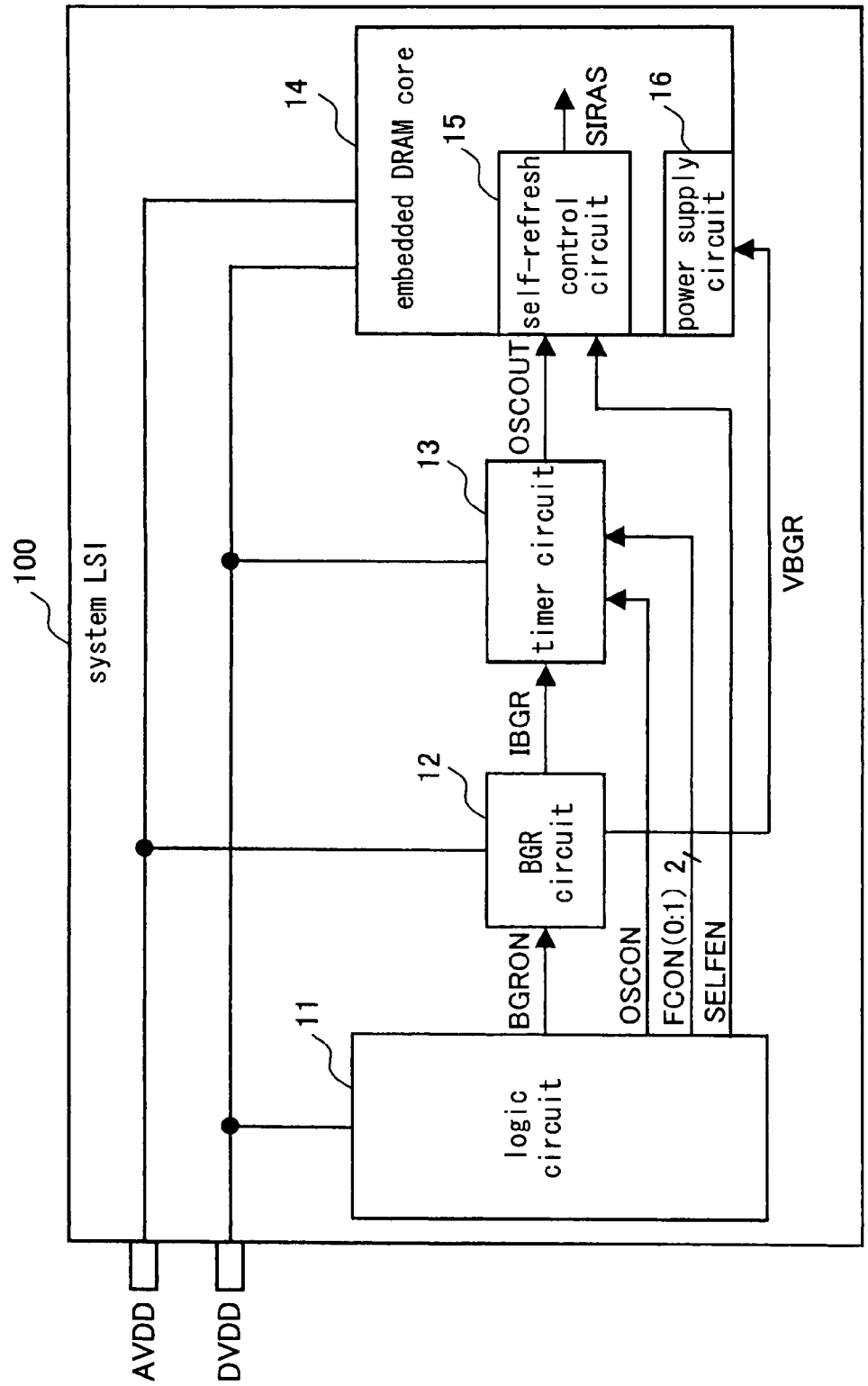
FIG. 1 is a block diagram illustrating a configuration of a system LSI, which is a semiconductor apparatus according to embodiments 1 and 2 of the present invention.

Hereinafter, a semiconductor apparatus according to embodiments of the present invention are described referring to the drawings.

Embodiment 1

FIG. 1 is a block diagram illustrating a system LSI of a semiconductor apparatus according to an embodiment 1 of the present invention. As shown in FIG. 1, a system LSI 100 comprises a logic circuit 11, BGR circuit (band gap reference circuit) 12, timer circuit 13, an embedded DRAM (dynamic random access memory) core 14, self-refresh control circuit 15 and power supply circuit 16.

The logic circuit 11 generates a BGR circuit control signal BGRON for controlling the operation/non-operation of the BGR circuit 12, timer circuit signal OSCON for controlling the operation/non-operation of the timer circuit 13, oscillation cycle adjustment signals FCON0 and FCON1 for adjusting an oscillation cycle of an output clock signal OSCOUT generated in the timer circuit 13, and self-refresh control signal SELFEN for controlling the self-refresh operation of the embedded DRAM core 14.

The timer circuit 13 is subject to an IBGR node constituting a constant current source of the BGR circuit 12, and generates the output clock signal OSCOUT in compliance with the current thereof.

The embedded DRAM core 14 is subject to the output clock signal OSCOUT of the timer circuit 13, and generates an internal RAS signal SIRAS used for self-refreshing and synchronizing with the signal.

The embedded DRAM core 14 has a self-refresh control circuit 15 inputting therein the self-refresh control signal SELFEN from the logic circuit 11 and the output clock signal OSCOUT from the timer circuit 13 to thereby perform the refresh operation and a power supply circuit 16 having a constant voltage source VBGR node generated in the BGR circuit 12 connected thereto.

The logic circuit 11 is provided with power supply from a power supply DVDD for digital circuit, and the BGR circuit 12 is provided with power supply from a power supply AVDD for analogue circuit. The timer circuit 13 is provided with the power supply from the power supply DVDD, and the embedded DRAM core 14 is provided with the power supplies from the power supply DVDD and power supply AVDD.

Figure 2:
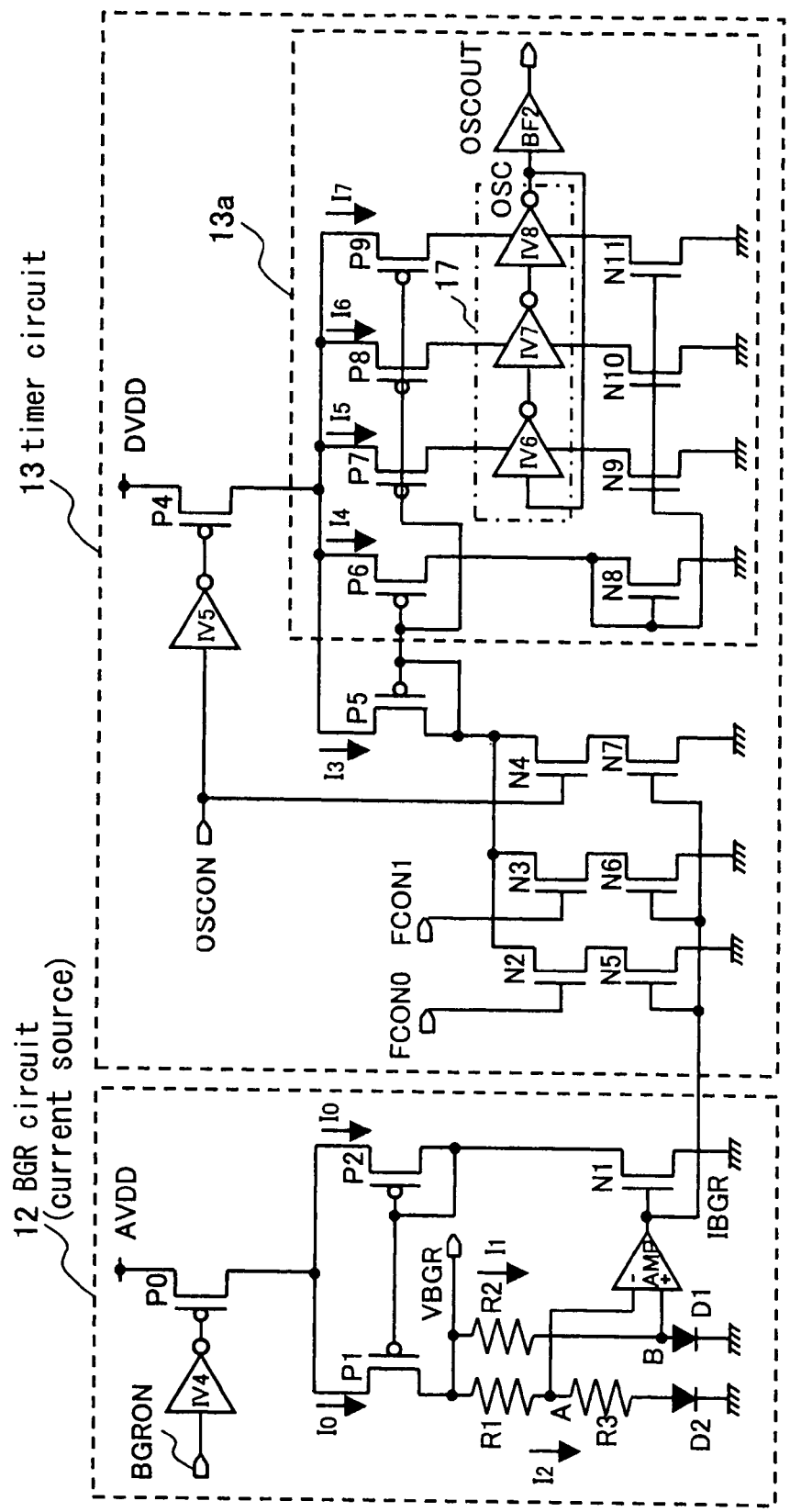
FIG. 2 is a circuit diagram illustrating configurations of a BGR circuit and a timer circuit of the semiconductor apparatus according to the embodiment 1.

Referring to FIG. 2, the BGR circuit 12 and timer circuit 13 respectively as an example of a current source and oscillation circuit are described in detail. The BGR circuit 12, as the current source, includes an inverter IV4, PMOS transistors P0–P2 constituting transistors of a first conductivity type, an NMOS transistor N1 constituting a transistor of a second conductivity type, resistors R1–R3, diodes D1 and D2, and an operational amplifier AMP.

A source of the PMOS transistor P0 is connected to the power supply AVDD. To a gate of the PMOS transistor P0 is inputted a signal resulting from inverting the control signal BGRON for controlling the operation/non-operation of the BGR circuit 12 in the inverter IV4. The PMOS transistor P0 constitutes a first transistor of the first conductivity type. The PMOS transistor P2 constitutes a second transistor of the first conductivity type. The NMOS transistor N1 constitutes a first transistor of the second conductivity type. A drain (power supply terminal) of the PMOS transistor P0 is connected to respective sources (first terminal) of the PMOS transistors P1 and P2. Respective gates (control terminal) of the PMOS transistors P1 and P2 are connected to a drain (second terminal) of the PMOS transistor P2. The drain (second terminal) of the PMOS transistor P2 is connected to a drain (first terminal) of the NMOS transistor N1. A gate (control terminal) of the NMOS transistor N1 is connected to an output node (output terminal) of the operational amplifier AMP. A source (second terminal) of the NMOS transistor N1 is connected to a ground potential VSS. Respective end portions of the resistors R1 and R2 on one side are connected to a drain of the PMOS transistor P1. The other end of the resistor R1 is connected to one end of the resistor R3 and an inversion input terminal (−) of the operational amplifier AMP. The other end of the resistor R3 is connected to an anode of the diode D2. A cathode of the diode D2 is connected the ground potential VSS. The other end of the resistor R2 is connected to an anode of the diode D1 and an non-inversion input terminal (+) of the operational amplifier AMP. A cathode of the diode D1 is connected to the ground potential VSS.

The operation of the BGR circuit 12 having the foregoing configuration is described below.

When the control signal BGRON is in an active high state, an output of the inverter IV4 is low, and the PMOS transistor P0 is turned on, in response to which a current is supplied from the power supply AVDD to thereby operate the BGR circuit 12. Further, the respective gates of the PMOS transistors P1 and P2 are connected to each other to thereby constitute a current mirror circuit. Accordingly, the current flowing through the PMOS transistor P2 is represented by a transistor size ratio with respect to a current $I_0$ flowing through the PMOS transistor P1 (P1/P2). In the present embodiment, for example, when the PMOS transistors P1 and P2 are arranged to be the same in size, the current flowing through the PMOS-transistor-P2 side is equal to the constant current $I_0$ flowing through the PMOS-transistor-P1 side. Further, when the current flowing through a system, where the resistor R1, resistor R3, and diode D2 are serially connected, is denoted by $I_2$, and the current flowing through a system, where the resistor R2 and diode D1 are serially connected, is denoted by $I_1$, the constant current $I_0$ is represented by the following formula 1:

$$I_0 = I_1 + I_2 \qquad 1$$

A current characteristic of the diodes is represented by the following formula 2:

$$I = I_s \cdot e^{qVd/kT} \qquad 2$$

In the foregoing formula, Is denotes saturation current, Vd denotes threshold voltage, k denotes Boltzmann constant, t denotes absolute temperature, and q denotes charge quantity of electron. The formula 2 can be modified into the following formula 3.

$$Vd = (kT/q) \cdot \ln(I/Is) \qquad 3$$

When the current flowing through the diode 1 is denoted by $I_1$, the threshold voltage of the diode D1 is denoted by $Vd_1$, the saturation current of the diode D1 is denoted by $Is_1$, the current flowing through the diode D2 is denoted by $I_2$, the threshold voltage of the diode D2 is denoted by $Vd_2$, and the saturation current of the diode D2 is denoted by $Is_2$, $\Delta Vd$, which is a difference between the threshold voltages of $Vd_1$ and $Vd_2$, is represented by the following formula 4:

$$\begin{aligned}\Delta Vd &= Vd_1 - Vd_2 \\ &= [(k/q) \cdot \ln\{(I_1 \cdot Is_2)/(Is \cdot Is_1)\}] \cdot T\end{aligned} \qquad 4$$

When a proportionality factor $K_1$ is represented by:

$$K_1 = (k/q) \cdot \ln\{(I_1 \cdot Is_2)/(I_2 \cdot Is_1)\} \qquad 5$$

the formula 4 can be represented by:

$$\Delta Vd = K_1 \cdot T \qquad 6$$

Because the proportional factor $K_1$ is positive, $\Delta Vd$, which is the difference between the threshold voltages of the diodes D1 and D2, has a positive temperature characteristic.

Further, the operational amplifier AMP functions so that a node A and a node B can be an identical potential, the following formulas 7 and 8 are satisfied:

$$R_1 \cdot I_2 = R_2 \cdot I_1 \qquad 7$$

$$Vd_1 = Vd_2 + R_3 \cdot I_2 \qquad 8$$

The following formulas 9 and 10 are derived from the formula 7:

$$I_1/I_2 = R_1/I_2 \qquad 9$$

$$I_1 = I_2 \cdot (R_1/I_2) \qquad 10$$

Further, because of $\Delta Vd = Vd_1 - Vd_2$, the following formula 11 is derived from the formula 8:

$$I_2 = \Delta Vd/R_3 \qquad 11$$

Therefore, $I_1$ is represented by the following formula 12 using the formula 11:

$$I_1 = (R_1/R_2) \cdot (\Delta Vd/R_3) \qquad 12$$

Therefore, the following formula 13 is derived from the formulas 1, 4, and 9:

$$I_1 = (R_1/I_2) \cdot (\Delta Vd/R_3) + (\Delta Vd/R_3) \qquad 13$$

-continued $$= \left[\left\{\left(\frac{R_1}{R_2}\right)/\left(\frac{R_2}{R_3}\right)\right\} \cdot \left(\frac{k}{q}\right) \cdot \ln\left\{\frac{(I_1 \cdot Is_2)}{(I_2 \cdot Is_1)}\right\}\right] \cdot T$$

$$= \left[\left\{\left(\frac{R_1}{R_2}\right)/\left(\frac{R_2}{R_3}\right)\right\} \cdot \left(\frac{k}{q}\right) \cdot \ln\left\{\frac{(R_1 \cdot Is_2)}{(R_2 \cdot Is_1)}\right\}\right] \cdot T$$

When a proportional factor $K_2$ is represented by:

$$K_2 = [\{(R_1/R_2)/(R_2/R_3)\} \cdot (k/q) \cdot \ln\{(R_1 \cdot Is_2)/(R_2 \cdot Is_1)\}] \qquad 14$$

the formula 14 is represented by:

$$I_o = K_2 \cdot T \qquad 15$$

Because the proportional factor $K_2$ is positive, the constant current $I_o$ has the positive temperature characteristic.

Further, the constant voltage source VBGR is represented by the following formula 16 using the formulas 12 and 13:

$$\begin{aligned}VBGR &= Vd_1 + R_2 \cdot I_1 \\ &= Vd_1 + R_2 \cdot [(R_1/R_2) \cdot (\Delta Vd/R_3)] \\ &= Vd_1 + \left[\left(\frac{R_1}{R_3}\right) \cdot \left(\frac{k}{q}\right) \cdot \ln\left\{\frac{(R_1 \cdot Is_2)}{(R_2 \cdot Is_1)}\right\}\right] \cdot T\end{aligned} \qquad 16$$

When the formula 16 is modified replacing the first term thereof by $I_1$ of the formula 12 and further using the formula 6:

$$\begin{aligned}VBGR &= Vd_1 + (I_1/R_3) \cdot \Delta Vd \\ &= Vd_1 + (I_1/R_3) \cdot K_1 \cdot T\end{aligned} \qquad 17$$

Further, when a proportional factor $K_3$ is represented by:

$$K_3 = (I_1/R_3) \cdot K_1 \qquad 18$$

Then, $$VBGR = Vd_1 + K_3 \cdot T \qquad 19$$

As shown in formula 15, the constant current $I_0$ has the positive temperature characteristic, while including no power-supply dependent item. The constant current $I_0$, therefore, can always supply a constant current despite the fluctuation of the power supply voltage, and further, can have an optional temperature characteristic by changing resistance values $R_1$–$R_3$ Of the resistors R1-R3 and a ratio of $Is_2/Is_1$.

Further, in the formula 19, the first term, $Vd_1$, has a negative temperature characteristic, and the second term, $K_3 \cdot T$, has the positive temperature characteristic, meaning that the first and second terms mutually negate the respective temperature characteristics. As a result, the constant voltage source VBGR results in the voltage source having no temperature characteristic, and further has no power-supply dependent item as in the formula 15. Therefore, the constant voltage source VBGR can always supply the constant voltage despite the fluctuation of the power supply voltage. When the constant voltage source VBGR is used as a reference potential for the power supply circuit 16 (internal circuit) inside the embedded DRAM core (memory) 14 (for example, reference voltage for differential amplifier constituting level detection circuit, or the like), a power supply of a distinguished characteristic having neither temperature characteristic nor power-supply voltage dependence.

Next, the timer circuit 13 is comprised of inverters IV5–IV8, PMOS transistors P4–P9, NMOS transistors N2–N11, and a buffer BF2. A source of the PMOS transistor P4 is connected to the power supply DVDD. To a gate of the PMOS transistor P4 is inputted a signal resulting from inverting the timer circuit signal OSCON for controlling the operation/non-operation of the timer circuit 13 in the inverter IV5. A drain of the PMOS transistor P4 is connected to sources of the PMOS transistors P5–P9. Gates of the PMOS transistors P5–P9 are connected to a drain of the PMOS transistor P5. The drain of the PMOS transistor P5 is connected to a drain of the NMOS transistor N4. To a gate of the NMOS transistor N4 is connected the timer circuit signal OSCON. To a source of the NMOS transistor N4 is connected a drain of the NMOS transistor N7. To a source of the NMOS transistor N7 is connected the ground potential VSS. Further, drains of the NMOS transistors N2 and N3 are connected to the drain of the NMOS transistor N4. A gate of the NMOS transistor N2 is connected to the oscillation cycle adjustment signal FCON0. A gate of the NMOS transistor N3 is connected to the oscillation cycle adjustment signal FCON1. A source of the NMOS transistor N2 is connected to a drain of the NMOS transistor N5. A source of the NMOS transistor N3 is connected a drain of the NMOS transistor N6. Sources of the NMOS transistors N5 and n6 are connected to the ground potential VSS. To gates of the NMOS transistors N5–N7 are connected the IBGR node outputted from the BGR circuit 12.

Further, a drain of the NMOS transistor N8 is connected to a drain of the PMOS transistor P6. Sources of the NMOS transistors N8–N11 are connected to the ground potential VSS. Gates of the NMOS transistors N8–N11 are connected to the drain of the NMOS transistor N8. Drains of the PMOS transistors P7–P9 are respectively supplied with the high-side power supply potentials of the inverters IV6–IV8. Drains of the NMOS transistors N9–N11 are respectively supplied with the low-side power supply potentials of the inverters IV6–IV8. An output node OSC of the inverter IV8 is connected to an input of the inverter IV6, and also connected to an input terminal of the buffer BF2. The output clock signal OSCOUT outputted from the buffer BF2 is inputted to the self-refresh control circuit 15 incorporated in the embedded DRAM core 14, which is shown in FIG. 1.

The operation of the timer circuit 13 having the foregoing configuration is described below.

The timer circuit signal OSCON is in the active high state, an output of the inverter IV5 is low, and the PMOS transistor P4 is turned on, in response to which the current is supplied from the power supply DVDD to thereby operate the timer circuit 13.

As described, the constant current $I_0$ flowing through a primary side and a secondary side formed from the current mirror of the BGR circuit 12 controls a gate potential of the NMOS transistor N1 in the operational amplifier AMP so that the potentials of the node A and node B can be identical, thereby resulting in the positive temperature characteristic. The output node BGR is retrieved from the operational amplifier AMP and connected to the gates of the NMOS transistors N5–N7 on the primary side of the current mirror of the timer circuit 13. Thus, the gates of the NMOS transistors N5–N7 are controlled in the operational amplifier in the same manner so that a constant current $I_3$ flowing through the primary side of the current mirror of the timer circuit 13 can have the positive temperature characteristic as well.

Further, the timer circuit signal OSCON is inputted to the gate of the NMOS transistor N4. When the timer circuit signal OSCON is in the active high state, the NMOS transistor N4 is turned on to be thereby conductive. In the same manner, the oscillation cycle adjustment signals FCON0 and FCON1 generated in the logic circuit 11 are respectively inputted to the gates of the NMOS transistors N2 and N3. When the oscillation cycle adjustment signals FCON0 and FCON1 are in the active high state, the NMOS transistors N2 and N3 are turned on to be thereby conductive.

Therefore, when the oscillation cycle adjustment signals FCON0 and FCON1 are both in the low state, the NMOS transistors N2 and N3 are both turned off, and the constant current $I_3$ flows through the ground potential VSS via the PMOS transistor P5, NMOS transistor N4, and NMOS transistor N7.

Next, it is assumed here that the oscillation cycle adjustment signal FCON0 alone is arranged to be in the active high state. In that case, because a resistor between the drain of the NMOS transistor N2 and the source of the NMOS transistor N5 and a resistor between the drain of the NMOS transistor N4 and the source of the NMOS transistor N7 are connected in parallel between a drain node of the PMOS transistor P5 and the ground potential VSS, a resistance value between the drain node of the PMOS transistor P5 and ground potential VSS is reduced relative to the case where the oscillation cycle adjustment signals FCON0 and FCON1 are both in the low state. Accordingly, a drain voltage of the PMOS transistor P5, which is determined by a voltage-dividing ratio of a resistance of the PMOS transistor P5 with respect to a resistor between the drain of the PMOS transistor P5 and ground potential VSS, is reduced, while a voltage $V_{GS}$ between the gate and source of the PMOS transistor P5 is increased. Therefore, the constant current $I_3$ is increased relative to the case where the oscillation cycle adjustment signals FCON0 and FCON1 are both in the low state.

When the oscillation cycle adjustment signals FCON0 and FCON1 are both in the active high state, the resistance value between the drain of the PMOS transistor P5 and ground potential VSS is further decreased, and the drain voltage of the PMOS transistor P5 is further reduced because of the described mechanism. Accordingly, the voltage $V_{GS}$ between the gate and source of the PMOS transistor P5 is further increased, resulting in the further increase of the constant current $I_3$.

According to the described mechanism, a current volume of the constant current $I_3$ having the positive temperature characteristic can be controlled by means of the oscillation cycle adjustment signals FCON0 and FCON1.

Figure 3:
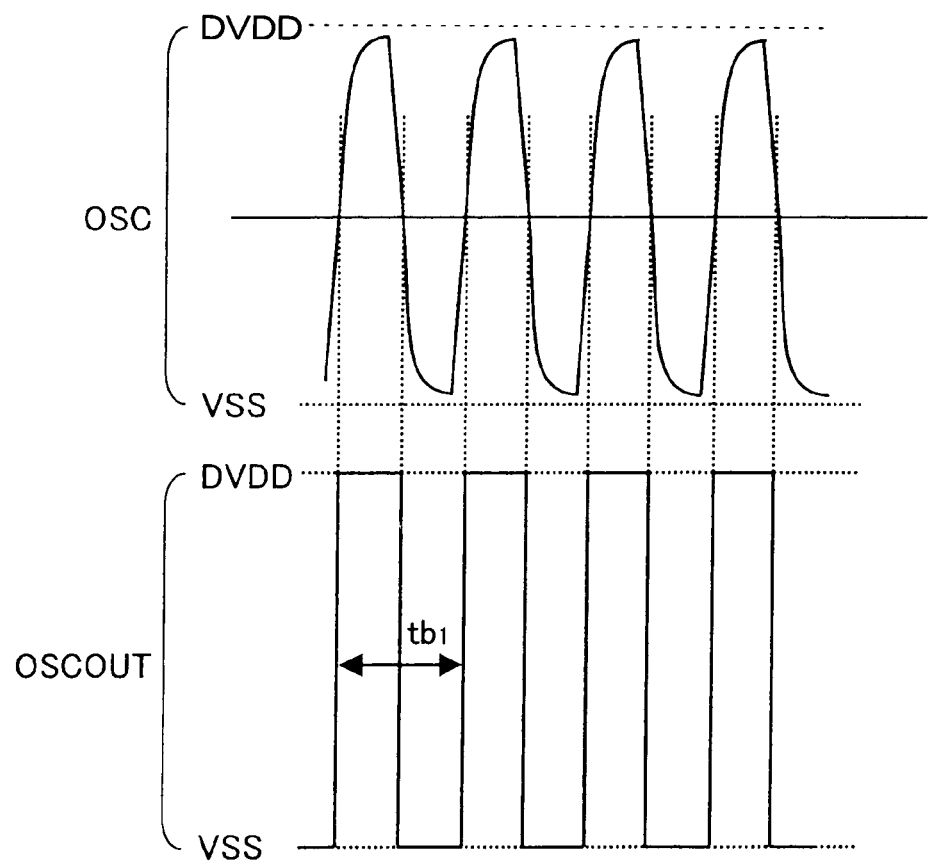
FIG. 3 is a view representing an internal waveform and an output waveform of the timer circuit of the semiconductor apparatus according to the embodiment 1.

When the gate of the PMOS transistor P5 is connected to the gates of the PMOS transistors P6–P9, and the gate of the NMOS transistor N8 is connected to the gates of the NMOS transistors N9–N11, the constant current $I_3$ having the positive temperature characteristic can be current-mirrored to thereby obtain constant currents $I_4$–$I_7$ having the positive temperature characteristic. The ring oscillator 17 comprised of an odd number of inverters IV6–IV8 serially connected to one another use the constant currents $I_5$–$I_7$ having the positive temperature characteristic as the current source. Current values of the constant currents $I_5$–$I_7$ increase as a temperature rises and decreases as the temperature falls. Therefore, a cycle of the oscillation pulse signal OSC of the ring oscillator 17 is shortened as the temperature rises and extended as the temperature falls. The oscillation pulse signal OSC is buffered by means of the buffer BF2 to thereby obtain the output clock signal OSCOUT (cycle $tb_1$) (refer to FIG. 3 for waveform).

Figure 4:
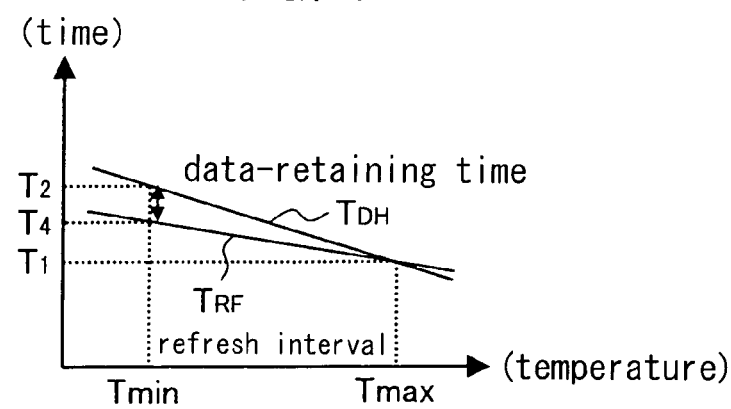
FIG. 4 is a relationship diagram of a refresh interval and a data-retaining time in the semiconductor apparatus according to the embodiments 1 and 2.
Figure 11:
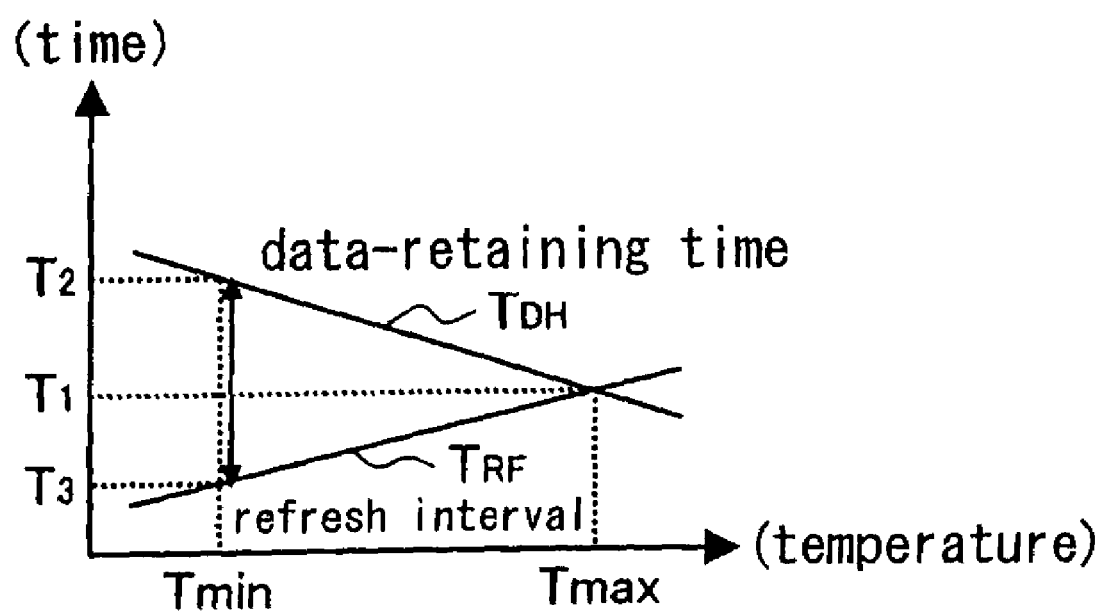
FIG. 11 is a relationship diagram of a refresh interval and a data-retaining time in a conventional semiconductor apparatus.

The output clock signal OSCOUT is, as described, inputed to the self-refresh control circuit 15 incorporated in the embedded DRAM core (memory) 14, and the self-refresh is performed by means of the internal RAS signal SIRAS obtained by dividing a frequency of the output clock signal OSCOUT. When the cycle of the oscillation pulse signal OSC is extended as the temperature falls as described, a cycle of the internal RAS signal SIRAS synchronizing with the oscillation pulse signal OSC is also extended. Therefore, the refresh interval $T_{RF}$ is, as shown in FIG. 4, lengthened as the temperature falls. The refresh interval $T_{RF}$ at a minimum guaranteed temperature Tmin results in $T_4$, and a difference between $T_4$ and $T_2$, which is a data retaining time at the Tmin, becomes substantially smaller compared to the conventional relationship shown in FIG. 11.

As described, according to the present embodiment, the power consumption on the lower-temperature side can be more effectively reduced. Further, the current source having no power-supply voltage dependence is used to thereby reduce the fluctuation of the oscillation frequency of the output clock caused by the variable power supply. Further, the current value of the constant current $I_3$ of the timer circuit 13 can be adjusted by means of the oscillation cycle adjustment signals FCON0 and FCON1 as described, therefore the current values $I_4$–$I_7$ generated by means of the current mirror can be adjusted in the same manner. Accordingly, the oscillation cycle of the oscillation pulse signal OSC can also be adjusted by means of the oscillation cycle adjustment signals FCON0 and FCON1 in the same manner. The timer circuit 13 can be operated with a voltage lower than the power supply AVDD of the BGR circuit 12 (power supply DVDD for logic circuit). Thus, the current consumption for the timer circuit 13 can be controlled using the power supply DVDD.

Figure 5:
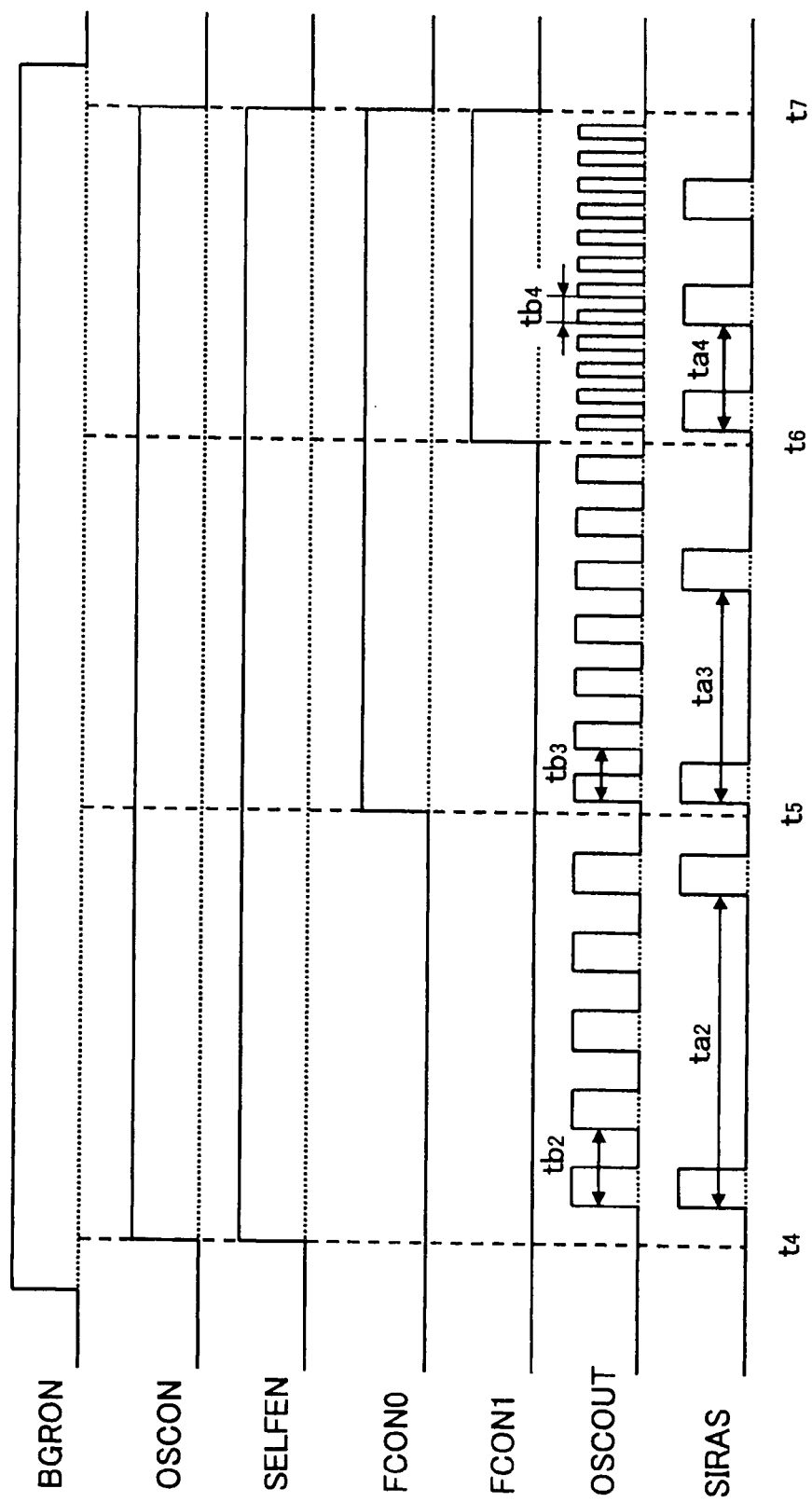
FIG. 5 is a timing chart illustrating an operation of the semiconductor apparatus according to the embodiments 1 and 2.

Next, the foregoing operation is described referring to a timing chart of FIG. 5.

When the control signal BGRON of the logic circuit 11 is in the active high state, the operation of the BGR circuit 12 starts, and the constant current $I_0$ is thereby generated. Next, the timer circuit signal OSCON is arranged to be in the active high state at time $t_4$, the output clock signal OSCOUT of the cycle $tb_2$ is generated. The oscillation cycle adjustment signals FCON0 and FCON1 to be then inputted to the timer circuit 13 are both in the low state. When the self-refresh control signal SELFEN is concurrently arranged to the in the active high state, the internal RAS signal (cycle $ta_2$) SIRAS used for self refreshing and synchronizing with the output clock signal OSCOUT is generated, and the self-refresh is performed by means of the signal SIRAS.

Next, when the oscillation cycle adjustment signal FCON0 alone is arranged to be in the active high state at time $t_5$, the oscillation cycle of the output clock signal OSCOUT is shortened to be $tb_3$, and the oscillation cycle of the internal RAS signal SIRAS is accordingly shortened as well to be $ta_3$.

Further, when the oscillation cycle adjustment signals FCON0 and FCON1 are both arranged to be in the active high state at time $t_6$, the oscillation cycle of the output clock signal OSCOUT is further shortened to be $tb_4$, and the internal RAS signal SIRAS is accordingly further shortened to be $ta_4$.

When the timer circuit signal OSCON is arranged to be low at time $t_7$, the output clock signal OSCOUT is not outputted, resulting in the termination of the self-refresh operation.

As so far described, in the case in which the operation/non-operation of the BGR circuit 12 and timer circuit 13 is controlled, the output clock signal OSCOUT is generated only when it is required, thereby reducing the power consumption.

Embodiment 2

Hereinafter a semiconductor apparatus according to an embodiment 2 of the present invention is described referring to the drawings.

Figure 6:
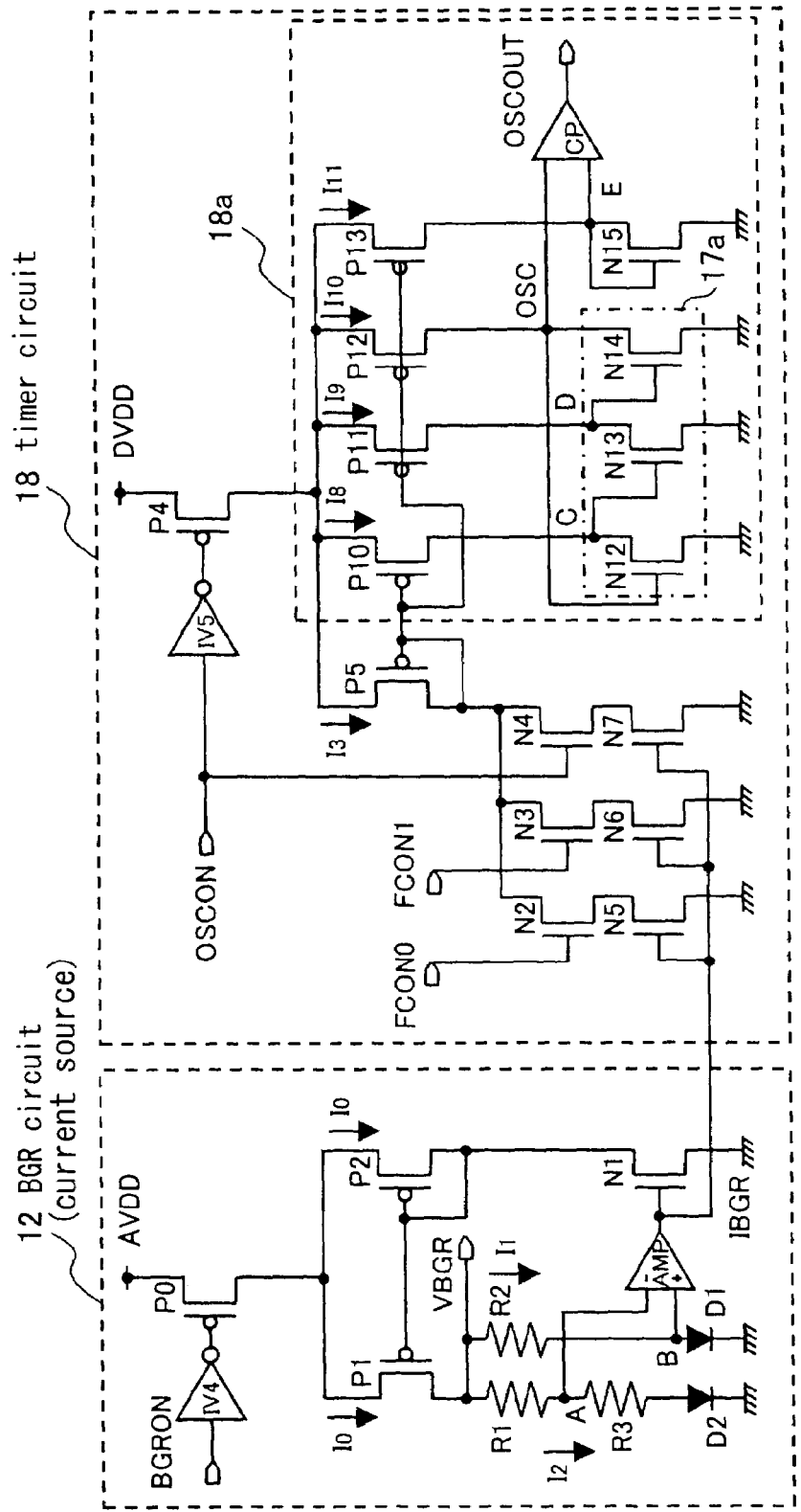
FIG. 6 is a circuit diagram illustrating configurations of a BGR circuit and a timer circuit of the semiconductor apparatus according to the embodiment 2.

FIG. 6 is a block diagram illustrating circuit configurations of a timer circuit 18 and a BGR circuit 12 of the semiconductor apparatus according to the embodiment 2. In FIG. 6, the BGR circuit 12 is configured in the same manner as in FIG. 2, while the timer circuit 18 is different to the configuration of FIG. 2 in a block 18a in contrast to a block 13 of FIG. 2, and the rest of the configuration is identical to the embodiment 1. The block 18a is comprised of PMOS transistors P10–P13, NMOS transistors N12–N15, and a comparator CP. Sources of the PMOS transistors P10–P13 are connected to the drain of the PMOS transistor P4 and the source of the PMOS transistor P5. Gates of the PMOS transistors P10–P13 are connected to the gate of the PMOS transistor P5 and the drain of the PMOS transistor P5. A drain of the PMOS transistor P10 is connected to a drain of the NMOS transistor N12 and a gate of the NMOS transistor N13. A gate of the NMOS transistor N12 is connected to a drain of the PMOS transistor P12, a drain of the NMOS transistor N14, and one end of the comparator CP. A source of the NMOS transistor N12 is connected to the ground potential VSS. A drain of the PMOS transistor P11 is connected to a drain of the NMOS transistor N13 and a gate of the NMOS transistor N14. A gate of the NMOS transistor N13 is connected to the drain of the NMOS transistor N12. A source of the NMOS transistor N13 is connected to the ground potential VSS. The drain of the PMOS transistor P12 is connected to the drain of the NMOS transistor N14 and the gate of the NMOS transistor N12. A source of the NMOS transistor N14 is connected to the ground potential VSS. A drain of the PMOS transistor P13 is connected to a drain of the NMOS transistor N15, a gate of the NMOS transistor N15, and the other end of the comparator CP. A source of the NMOS transistor N15 is connected to the ground potential VSS.

The operation of the timer circuit 18 including the block 18a configured in the foregoing manner is described below.

As described in the embodiment 1, the constant current $I_3$ having the positive temperature characteristic is generated from constant current $I_0$ having the same positive temperature characteristic generated in the BGR circuit 12. Because the gates of the PMOS transistors P10–P13 are connected to the gate of the PMOS transistor P5, constant currents $I_8$–$I_{11}$ having the positive temperature characteristic can be generated by means of the current mirror in the embodiment 2 as well. A ring oscillator 17a comprised of the NMOS transistors N12–N14 is operated using the current from the constant currents $I_8$–$I_{11}$ as the current source. Therefore, the oscillation cycle of the oscillation pulse signal OSC of the ring oscillator 17a also has the positive temperature characteristic that the cycle is shortened in compliance with the rise of the temperature. The ring oscillator 17a is comprised of a 2n−1 number of transistors of the second conductivity type with the n as an integer, which is set to be n=2 in the embodiment 2. In the ring oscillator 17a, sources (first terminal) of the plurality of transistors, which are first through (2n−2)th transistors, are connected to gates (control terminal) of transistors each having a number larger by one. A source (first terminal) of the (2n−1)th transistor is connected to a gate (control terminal) of the first transistor, and drains (second terminal) of all the transistors are connected to the ground potential.

It is assumed here that the threshold voltages of the NMOS transistors N12–N15 are all set to Vtn, the drain of the NMOS transistor N12 is C node, drain of the NMOS transistor N13 is D node, and node of the NMOS transistor N14 is OSC. Based on the assumption, the operations of the nodes, and the output clock signal OSCOUT, which is the output of the comparator CP, are described referring to FIG. 7.

When a potential of the node OSC exceeds the threshold voltage Vtn at time $t_{10}$, the NMOS transistor N12 is turned on, and a charge from the node C runs through to the ground potential VSS via the NMOS transistor N12. A potential of the node C therefore starts to fall below a potential Vtn+α.

When the potential of the node C falls below the threshold voltage Vtn at time $t_{11}$, the NMOS transistor N13 is turned off, and the node D is charged with the current $I_9$. A potential of the node D is therefore starts to exceed a potential Vtn−α.

When the potential of the node D exceeds the threshold voltage Vtn at time $t_{12}$, the NMOS transistor N14 is turned on, and a charge from the node OSC runs through to the ground potential VSS via the NMOS transistor N14. The potential of the node OSC therefore starts to fall below the threshold voltage Vtn+α.

When the potential of the node OSC falls below the threshold voltage Vtn at time $t_{13}$, the NMOS transistor N12 is turned off, and the node C is charged with the current $I_8$. The potential of the node C is therefore starts to exceed the potential Vtn−α.

When the potential of the node C exceeds the threshold voltage Vtn at time $t_{14}$, the NMOS transistor N13 is turned on, and a charge from the node D runs through to the ground potential VSS via the NMOS transistor N13. The potential of the node D therefore starts to fall below the voltage Vtn+α.

When the potential of the node D falls below the threshold voltage Vtn at time $t_{15}$, the NMOS transistor N14 is turned off, and the node OSC is charged with the current $I_{10}$. The potential of the node OSC therefore starts to exceed the potential Vtn−α, and reaches the threshold voltage Vtn again at time $t_{16}$.

The oscillation pulse signal OSC obtained in the foregoing manner is compared to the reference potential (NMOS transistor N15 is diode-connected to thereby obtain a drain node E of the Vtn potential) in the comparator CP to thereby obtain the output clock signal OSCOUT of a cycle $tb_5$ fully swung between the DVDD power supply and ground potential VSS. Sizes of the PMOS transistor P13 and NMOS transistor N15 are adjusted so as to maintain a potential of the node E at the threshold voltage Vtn.

As so far described, because the ring oscillator 17a is comprised of the NMOS transistors, the circuit can be reduced in size compared to the embodiment 1, wherein the ring oscillator 17 is comprised of the CMOS inverters. Further, as in the embodiment 1, the cycle of the oscillation pulse is lengthened and the refresh interval $T_{RF}$ on the lower-temperature side is extended as the temperature falls, thereby more effectively reducing the power consumption on the lower-temperature side.

Referring to the oscillation cycle adjustment signals FCON0 and FCON1 used to adjust the oscillation cycle, which are described in the embodiments 1 and 2, the numbers of the signals and the transistors subject to the signals are not limited to the embodiments.

In the embodiment 1, the ring oscillator 17 is constituted by the combination of the circuit components in three stages, which are the CMOS inverters, PMOS transistors as the current source thereof, and MOS transistors. The ring oscillator 17 is, however, only required to comprise an odd number of stages, and not limited to the embodiment 1.

In the embodiment 2, the ring oscillator 17a is constituted by the combination of the circuit components in three stages, which are the NMOS transistors and the PMOS transistors as the current source thereof. The ring oscillator 17a is, however, only required to comprise an odd number of stages, and not limited to the embodiment 2.

The BGR circuit control signal BGRON, timer circuit signal OSCON, oscillation cycle adjustment signals FCON0 and FCON1, and self-refresh control signal SELFEN are arranged to be high-active, however, can be arranged to be low with inverted polarities for the operation of the BGR circuit 12 and timer circuits 13 and 18.

Further, in the embodiments 1 and 2, when the transistors having different film thicknesses are used for the NMOS transistor N1 in the BGR circuit 12 subject to the output node IBGR of the operational amplifier AMP and the NMOS transistors N5–N7 in the timer circuits 13 and 18, the constant currents of the timer circuits cannot be controlled to have a desired temperature characteristic because the transistors have different characteristics resulting from their different thicknesses. Therefore, it is necessary for the NMOS transistors N1 and N5–N7 to comprise the transistors having the same thickness. Thus, the constant currents of the timer circuits can be thereby controlled to have the desired temperature characteristic.

Further, in the embodiments 1 and 2, when all the transistors included in the BGR circuit 12 and timer circuits 13 and 18 are thin-filmed, a further advantage of area reduction and lower voltage can be enjoyed.

Further, in the embodiments 1 and 2, when the diodes D1 and D2 of the BGR circuit 12 are formed in a triple well structure, which is the same as the memory cell region of the DRAM, minority carrier injected from the diodes to a substrate can be prevented from dispersing. A possible malfunction of the DRAM caused by the loss of electric charge stored in the memory cell or the like can be thereby prevented from happening. Further, the diodes can be formed in the same process as the DRAM.

Further, in the embodiments 1 and 2, when the resistors in the BGR circuit 12 are made of materials used to make a word line of the DRAM and in the same forming process as the word lines, the resistors can be formed in the same process as the DRAM without increasing the manufacturing steps.

Figure 8:
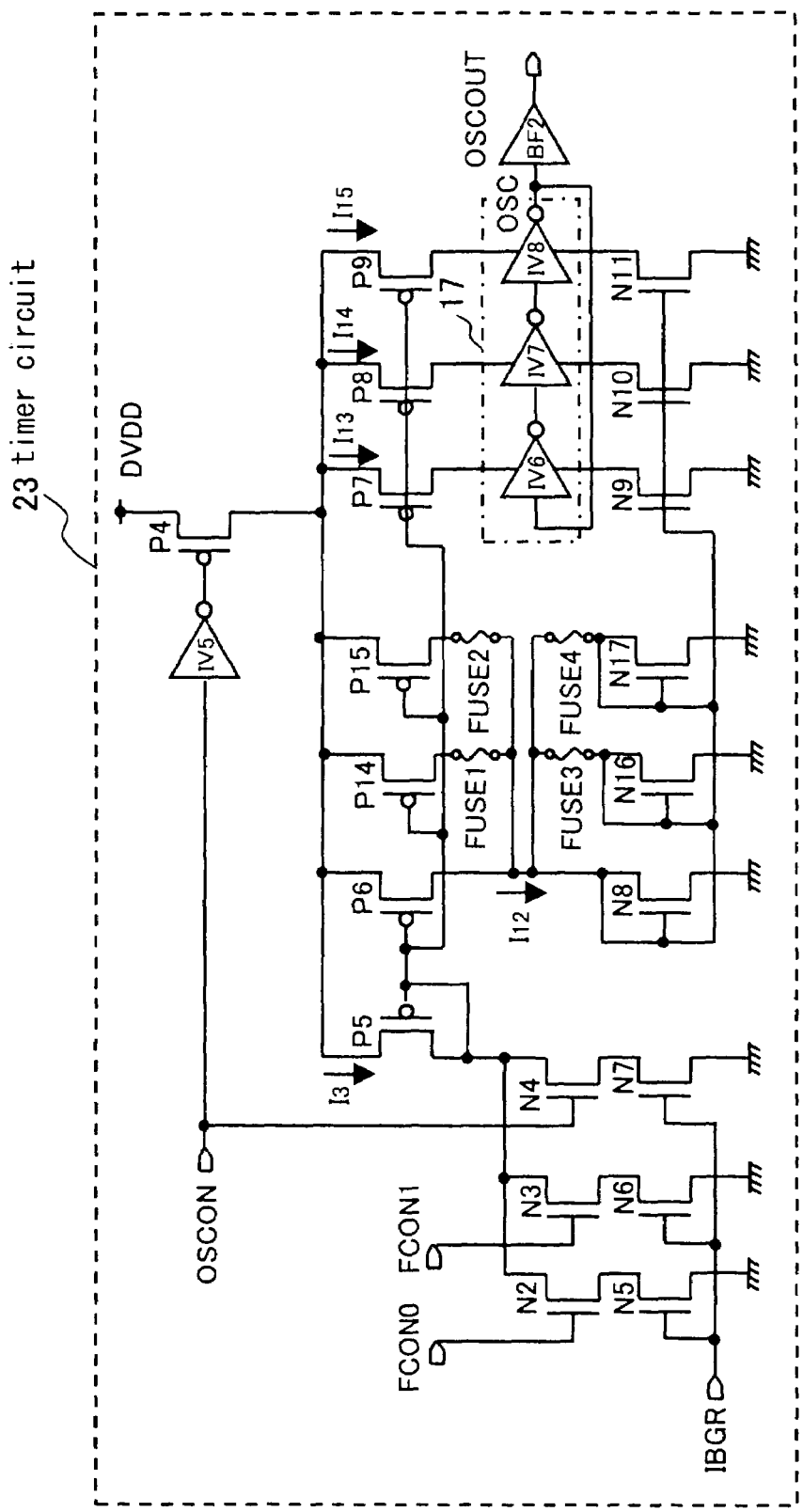
FIG. 8 is a circuit diagram illustrating configurations of a BGR circuit and a timer circuit of the semiconductor apparatus according to a modification example of the embodiments 1 and 2.
Figure 9:
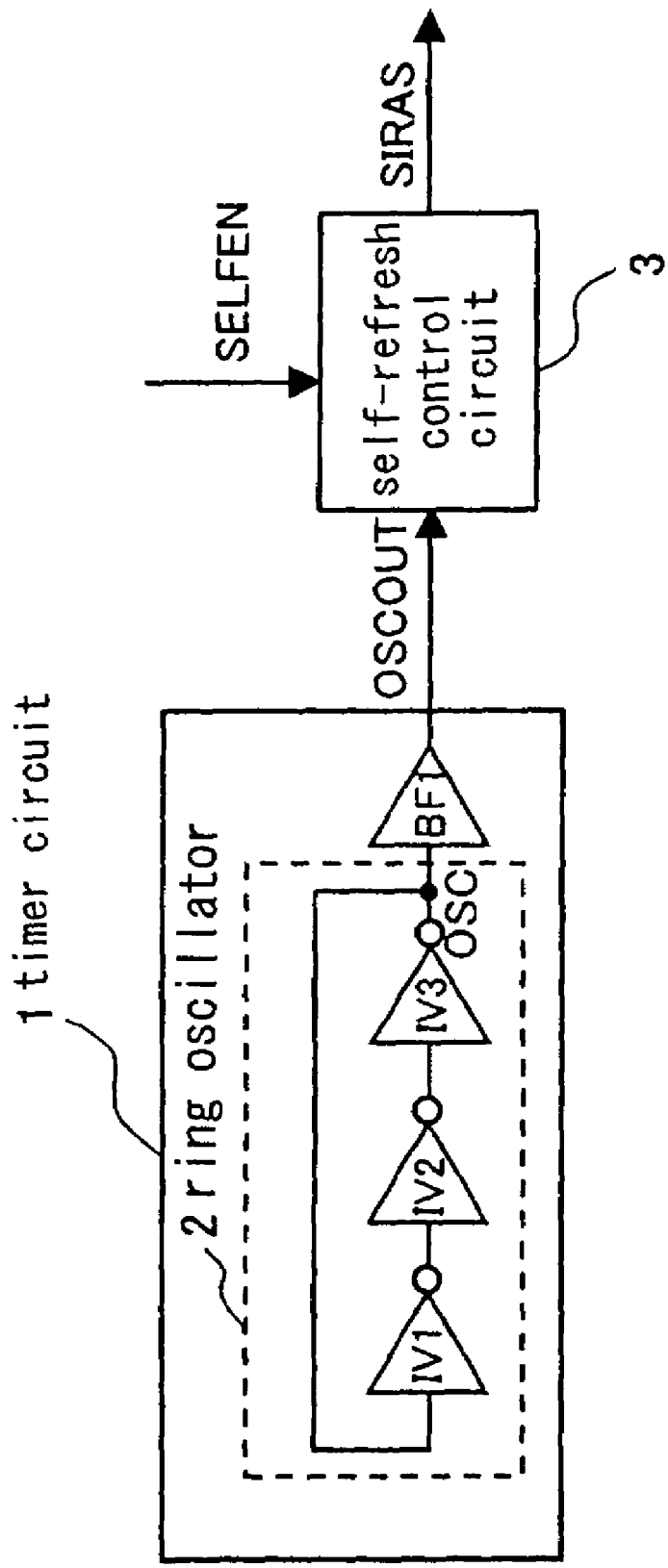
FIG. 9 is a block diagram illustrating configurations of a timer circuit and self-refresh control circuit of a conventional semiconductor apparatus.
Figure 10:
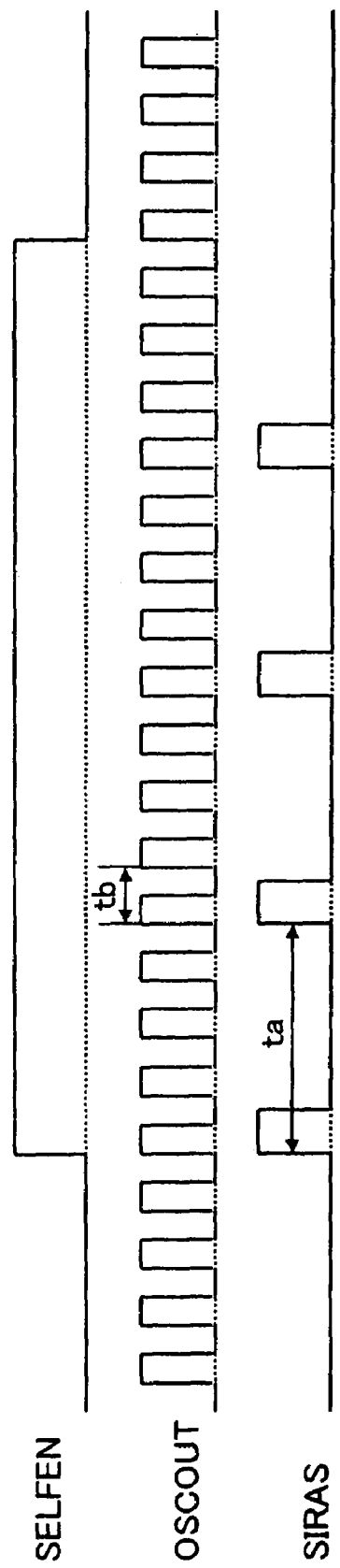
FIG. 10 is a timing chart illustrating an operation of a conventional semiconductor apparatus.

Further, in order to allow the oscillation frequency of the timer circuit to fluctuate, as in a timer circuit 23 of FIG. 8, the PMOS transistors P14 and P15 are provided in parallel with the PMOS transistor P6, and fuses, FUSE 1 and FUSE 2, are respectively provided in series with the PMOS transistors P14 and P15. Further, the NMOS transistors N16 and N17 are provided in parallel with the NMOS transistor N8, and fuses, FUSE 3 and FUSE 4, are respectively provided in series with the NMOS transistors N16 and N17.

When the fuses are optionally cut off, a current value of a constant current $I_{12}$ can be changed. In compliance with the current, currents $I_{13}$–$I_{15}$ to be supplied to the ring oscillator 17 also change, thus allowing the oscillation frequency of the ring oscillator 17 to fluctuate.

The numbers of the transistors and fuses, and shapes of the fuses, which are connected in parallel with the PMOS transistor P6 and NMOS transistor N8, are not limited to the illustration in the drawing. The timer circuit 23 was described based on the timer circuit 13 of the embodiment 1, however, can be configured in the same manner in the embodiment 2.

Further, in the embodiments 1 and 2, when the constant voltage source VBGR generated in the BGR circuit is, for example, used as an internal power supply for the DRAM, it becomes unnecessary to provide an additional internal power-supply circuit for the DRAM in the system LSI, thereby reducing a chip in area.

Further, in the embodiments 1 and 2, the BGR circuit can be located outside the DRAM, which generates a large instantaneous current and noise, to thereby avoid the noise influence from the DRAM so that the BGR circuit can be stably operated.

As thus far described, in the described embodiments, the oscillation circuit (timer circuit) is constituted by means of the current source having the positive temperature characteristic. In this manner, the oscillation cycle of the output clock from the oscillation circuit (timer circuit) can be lengthened as the temperature falls. Therefore, when the output clock is used for refreshing, the power consumption on the lower-temperature side can be effectively reduced. Further, the use of the current source having no power-supply voltage dependence can reduce the fluctuation of the oscillation frequency of the output clock, which is caused by the variable power supply.

What is claimed is:

1. A semiconductor apparatus comprising:
a current source, the current source increasing a current volume in compliance with a rise of a temperature:
an oscillation circuit, the oscillation circuit driven by the current from the current source and outputting a clock for refresh control;
a constant voltage source, the constant voltage source generating a constant voltage using the current source; and
a memory, the memory using the constant voltage generated by the constant voltage source as a reference voltage for a power supply circuit, the memory further performing the refresh in synchronization with the output clock of the oscillation circuit or the divided clock thereof.

2. A semiconductor apparatus comprising:
a current source, the current source increasing a current volume in compliance with a rise of a temperature; and
an oscillation circuit, the oscillation circuit driven by the current from the current source and outputting a clock for refresh control,
wherein the current source comprises a first diode, a second diode, at least one transistor, and at least one resistor, and
the current source generates a current in proportion to a voltage difference between a threshold voltage of the first diode and a threshold voltage of the second diode.

3. A semiconductor apparatus comprising:
a current source, the current source increasing a current volume in compliance with a rise of a temperature; and
an oscillation circuit, the oscillation circuit driven by the current from the current source and outputting a clock for refresh control,
wherein the current source is configured in the manner that,
a first terminal of a first transistor of a first conductivity type is connected to a power supply terminal,
a first terminal of a second transistor of the first conductivity type is connected to the power supply terminal,
a second terminal of the first transistor of the first conductivity type is connected to one end of a first resistor and one end of a second resistor,
a control terminal of the first transistor of the first conductivity type, a control terminal of the second transistor of the first conductivity type, and a second terminal of the second transistor of the first conductivity type are connected to one another,
another end of the first resistor is connected to one end of a third resistor and a first input terminal of an operational amplifier,
another end of the second resistor is connected to a second input terminal of the operational amplifier and an anode terminal of a first diode,
a cathode terminal of the first diode is connected to a ground potential,
another end of the third resistor is connected to an anode terminal of a second diode,
a cathode terminal of the second diode is connected to the ground potential,
the second terminal of the second transistor of the first conductivity type and a first terminal of a first transistor of a second conductivity type are connected to each other,
a control terminal of the first transistor of the second conductivity type is connected to an output terminal of the operational amplifier,
a second terminal of the first transistor of the second conductivity type is connected to the ground potential, and
the current source generates a current in proportion to a voltage difference between a threshold voltage of the first diode and a threshold voltage of the second diode.

4. A semiconductor apparatus as claimed in claim 1, wherein the oscillation circuit constitutes a ring oscillator having an odd number of inverters serially connected.

5. A semiconductor apparatus as claimed in claim 1, wherein the oscillation circuit constitutes a ring oscillator comprised of a 2n−1 number of transistors of a second conductivity type.

6. A semiconductor apparatus as claimed in claim 1, wherein the oscillation circuit is constituted by a ring oscillator,
the ring oscillator is comprised of a 2n−1 number of transistors of a second conductivity type, wherein
first terminals of the plurality of transistors, which are first through (2n−2)th transistors, are respectively connected to control terminals of transistors each having a number larger by one,
a first terminal of the (2n−1)th transistor is connected to a control terminal of the first transistor, and
second terminals of all the transistors are connected to the ground potential.

7. A semiconductor apparatus as claimed in claim 1, wherein the oscillation circuit comprises a function of terminating an oscillation thereof.

8. A semiconductor apparatus as claimed in claim 1, wherein the oscillation circuit is capable of fluctuating a frequency.

9. A semiconductor apparatus as claimed in claim 1, wherein the oscillation circuit and the current source respectively use different power supplies.

10. A semiconductor apparatus as claimed in claim 1, wherein the current source is capable of terminating an operation thereof.

11. A semiconductor apparatus as claimed in claim 1, wherein the constant voltage of the constant voltage source is used as a reference potential for an internal circuit of the memory.

12. A semiconductor apparatus as claimed in claim 3, wherein
in a system LSI comprising transistors having a plurality of insulation film thicknesses,
the first transistor of the second conductivity type of the current source connected to the output terminal of the operational amplifier and a transistor of the oscillation circuit connected to the first transistor have a same insulation film thickness.

13. A semiconductor apparatus as claimed in claim 3, wherein
in a system LSI comprising transistors having a plurality of insulation film thicknesses,
the first transistor of the second conductivity type of the current source connected to the output terminal of the operational amplifier and a transistor of the oscillation circuit connected to the first transistor both have thick insulation films, and
any other transistor included in the current source and the oscillation circuit has a thin insulation film.

14. A semiconductor apparatus as claimed in claim 3, wherein
in a system LSI comprising transistors having a plurality of insulation film thicknesses,
the current source and the oscillation circuit both uses transistors having thin insulation films.

15. A semiconductor apparatus as claimed in claim 2, wherein
the diodes of the current source are formed in a same structure as a well structure of a memory cell region of a DRAM.

16. A semiconductor apparatus as claimed in claim 2, wherein
the resistor of the current source is formed by means of a same wiring as a word line of a DRAM.

17. A semiconductor apparatus as claimed in claim 2, wherein
the resistor of the current source is formed in a same step as a step for forming a word line of a DRAM.

18. A semiconductor apparatus as claimed in claim 3, wherein
the oscillation circuit comprises current-mirror transistors having different sizes and is capable of fluctuating an oscillation frequency by changing a current value.

19. A semiconductor apparatus as claimed in claim 18, wherein
fuses are used to switch over sizes of the current-mirror transistors.

20. A semiconductor apparatus as claimed in claim 1, wherein
the constant voltage of the constant voltage source generating the constant voltage using the current source is used as a voltage source for other circuits.

21. A semiconductor apparatus comprising:
a current source, the current source increasing a current volume in compliance with a rise of a temperature; and
an oscillation circuit, the oscillation circuit driven by the current from the current source and outputting a clock for refresh control,
wherein in a system LSI,
the oscillation circuit is disposed inside a DRAM core, and the current source is disposed outside the DRAM core.

* * * * *